United States Patent
Galbraith et al.

(10) Patent No.: US 6,191,556 B1
(45) Date of Patent: Feb. 20, 2001

(54) METHOD AND APPARATUS FOR ESTIMATING THE SERVICE LIFE OF A BATTERY

(75) Inventors: Robert Edward Galbraith; Jessica Marie Gisi; Steven Paul Norgaard, all of Rochester; Dennis David Reetz, St. Charles; Donald James Ziebarth, Rochester, all of MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/415,652

(22) Filed: Oct. 12, 1999

(51) Int. Cl.$^7$ .................................................. H02J 7/00
(52) U.S. Cl. ........................................ 320/132; 320/150
(58) Field of Search ............................... 324/431, 433; 702/63; 701/22; 320/132

(56) References Cited

U.S. PATENT DOCUMENTS

| | | | |
|---|---|---|---|
| 4,803,416 | * 2/1989 | Abiven et al. | 320/132 |
| 5,278,487 | * 1/1994 | Koenck | 320/132 |
| 5,537,023 | * 7/1996 | Hanselmann et al. | 320/132 |
| 5,600,230 | 2/1997 | Dunstan | 320/122 |
| 5,675,258 | 10/1997 | Kadouchi et al. | 324/433 |
| 5,698,965 | * 12/1997 | York | 320/132 |
| 5,712,795 | * 1/1998 | Layman et al. | 320/132 |
| 5,714,868 | 2/1998 | Uchida et al. | 320/150 |
| 5,744,939 | 4/1998 | Leppo | 320/153 |
| 5,767,659 | 6/1998 | Farley | 320/150 |
| 5,895,440 | * 4/1999 | Proctor et al. | 324/433 |
| 5,917,305 | * 7/1999 | Faulk | 320/132 |
| 5,945,808 | * 9/1999 | Kikuchi et al. | 320/132 |
| 6,011,380 | * 3/1999 | Paryani et al. | 320/132 |
| 6,034,507 | * 8/1998 | Ikawa et al. | 320/132 |
| 6,040,683 | * 5/1999 | Mottier | 320/132 |
| 6,064,180 | * 5/2000 | Sullivan et al. | 320/132 |

FOREIGN PATENT DOCUMENTS

| | | |
|---|---|---|
| 0216662 | * 4/1987 | (FR) . |
| 5095635 | 4/1993 | (JP) . |

* cited by examiner

Primary Examiner—Peter S. Wong
Assistant Examiner—Pia Tibbits
(74) Attorney, Agent, or Firm—Dugan & Dugan, LLP

(57) ABSTRACT

An apparatus is provided for estimating the service life of a battery. The apparatus includes a temperature measurement circuit that measures a temperature of an operating environment of the battery and outputs a signal representative of the temperature of the operating environment. A controller coupled to the temperature measurement circuit receives the temperature signal therefrom and estimates the service life of the battery based on the temperature signal. Preferably, the temperature measurement circuit outputs a signal representative of a temperature range in which the measured operating environment temperature resides and the controller estimates the service life of the battery based on the temperature range signal output by the temperature measurement circuit. A method and a computer program product also are provided for similarly estimating the service life of a battery.

20 Claims, 3 Drawing Sheets

Figure 1A:
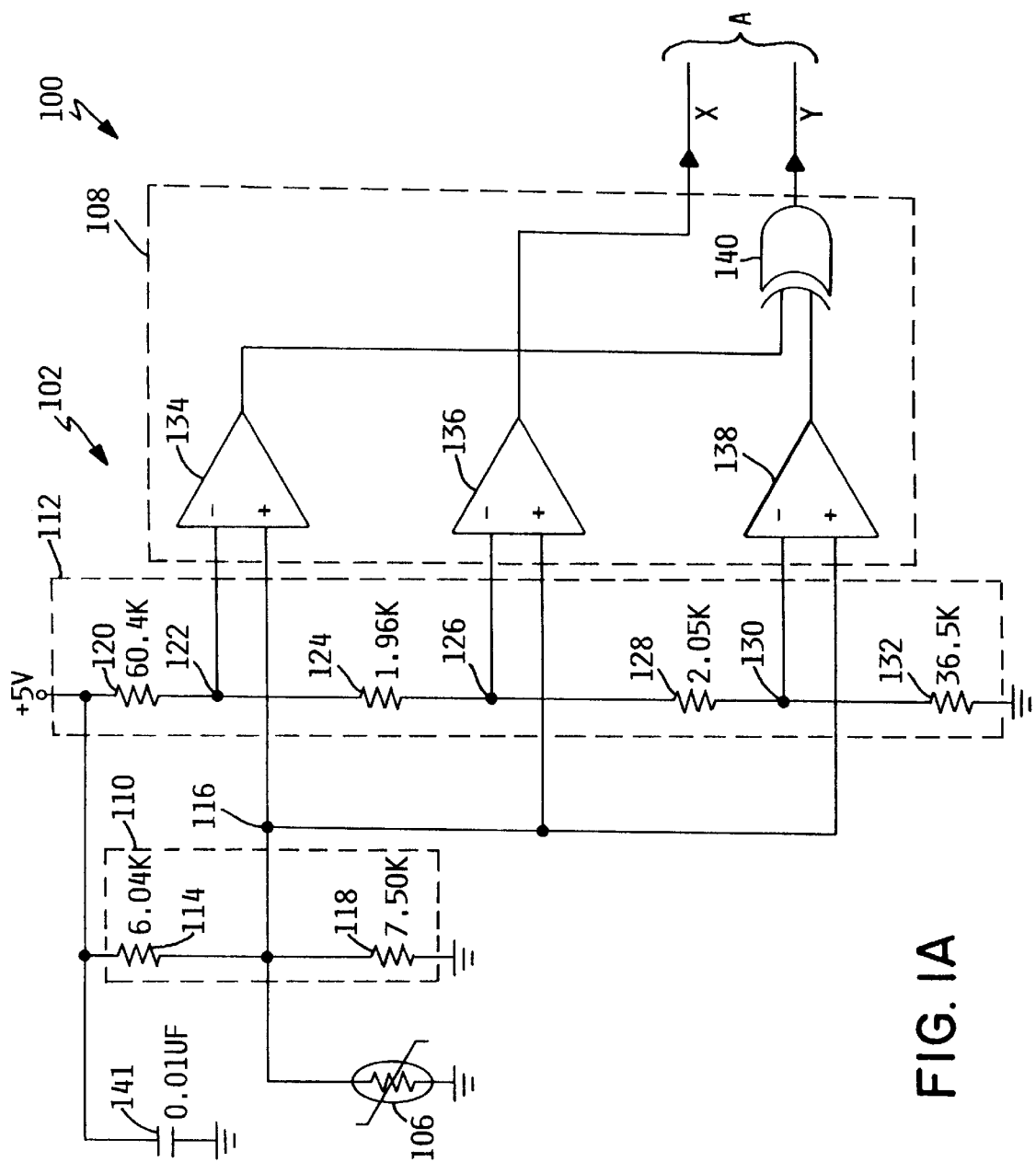

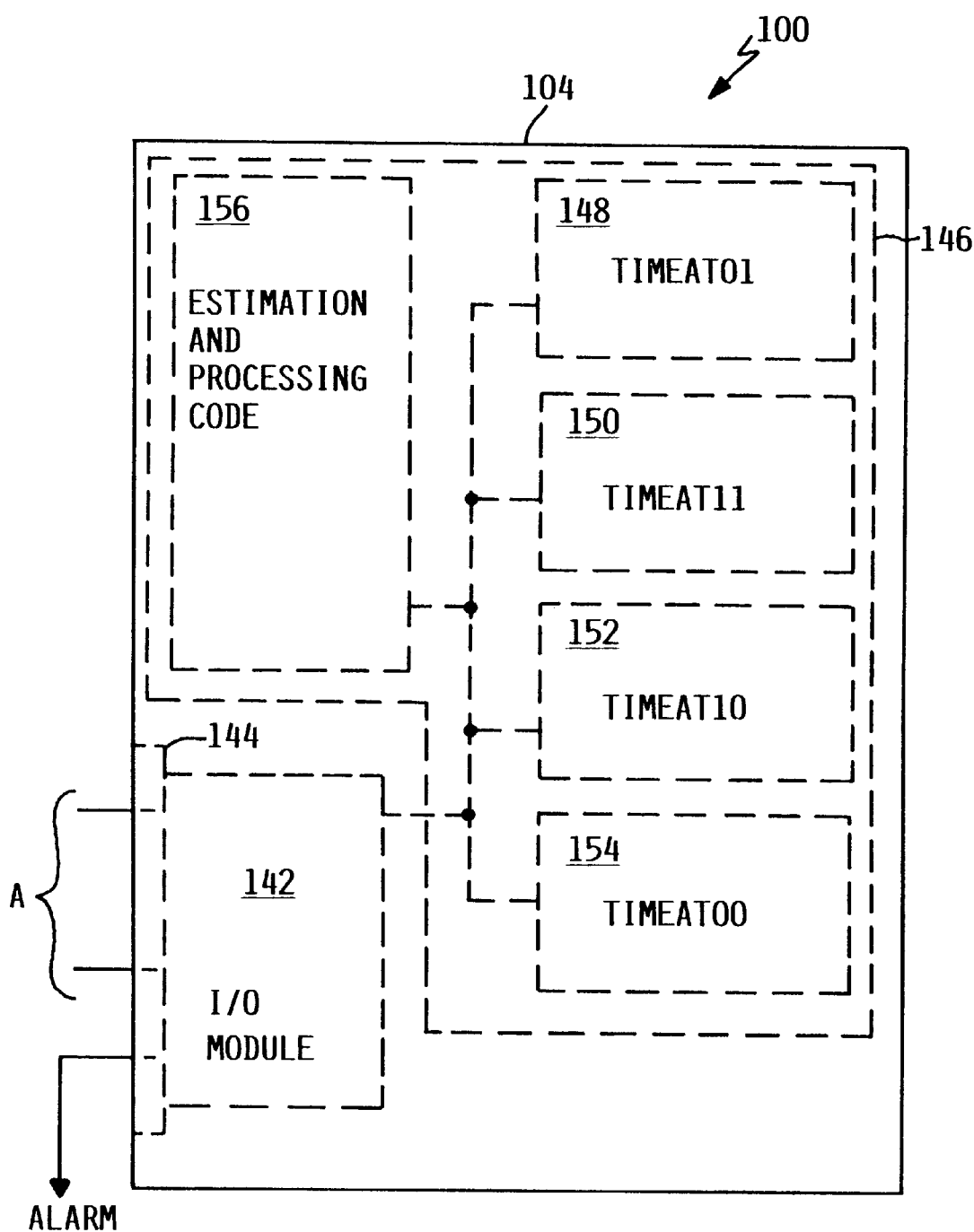
FIG. IB

METHOD AND APPARATUS FOR ESTIMATING THE SERVICE LIFE OF A BATTERY

FIELD OF THE INVENTION

The present invention relates generally to battery technology, and more particularly to a method and apparatus for estimating the service life of a battery.

BACKGROUND OF THE INVENTION

For years single use and rechargeable nickel-cadmium (NiCd) batteries have been employed to power portable radios, shavers, laptop computers, non-volatile memory components, etc. NiCd batteries exhibit good capacity (i.e., the length of useable time between charges), reusability (i.e., the ability to be recharged) and service life (i.e., the length of time a battery may be used before a minimum useful battery capacity, such as 60% of the battery's maximum or "initial" capacity, is unachievable by re-charging). However, due to environmental concerns over the disposal of heavy metals such as cadmium, alternative battery technologies have been developed.

Nickel metal hydride (NiMH) batteries offer a more environmentally friendly alternative to NiCd batteries. NiMH batteries have better capacity than NiCd batteries, but suffer from poor battery service life in hot operating environments (e.g., above 36° C.). For example, for operating environments having a temperature of about 28° C. or less, the service life of a NiMH battery is about 36 months. However, for operating environments having a temperature of about 36° C. or higher, the service life of a NiMH battery is only about 19.5 months.

Because batteries typically are rated based on the worst case operating environment (e.g., about 40° C. for NiMH batteries) even though actual battery operating environments rarely approach the worst case operating environment, NiMH batteries often are changed prematurely. The high costs associated with service calls, service disruption and battery disposal that accompany battery replacement necessitate longer battery service life.

SUMMARY OF THE INVENTION

To address the need for longer battery service life, a method and an apparatus for estimating the service life of a battery are provided. Specifically, battery service life is estimated based on the actual temperature of the operating environment of a battery rather than on a worst case operating environment temperature. Preferably battery service life is estimated periodically or is otherwise "integrated" during battery operation to account for any changes in the operating environment temperature of the battery during its operation and to account for both the present and the past operating environment temperatures of the battery. By estimating the service life of a battery based on its actual operating environment temperature, a worst case service life need not be assumed for the battery, and the battery need not be replaced prematurely. Maximum service life is therefore extracted from every battery.

In a first aspect of the invention, an apparatus is provided for estimating the service life of a battery. The apparatus includes a temperature measurement circuit that measures a temperature of an operating environment of the battery and outputs a signal representative of the temperature of the operating environment. The apparatus further includes a controller coupled to the temperature measurement circuit that receives the temperature signal therefrom and estimates the service life of the battery based on the temperature signal. Preferably, the temperature measurement circuit outputs a signal representative of a temperature range in which the measured operating environment temperature resides and the controller estimates the service life of the battery based on the temperature range signal output by the temperature measurement circuit.

In a second aspect of the invention, a method is provided for estimating the service life of a battery by measuring a temperature of an operating environment of the battery and by estimating the service life of the battery based on the measured operating environment temperature. Preferably, measuring the temperature of the operating environment of the battery includes outputting a signal representative of a temperature range in which the measured operating environment temperature resides. The service life of the battery is estimated based on the temperature range signal.

In a third aspect of the invention, a computer program product is provided for estimating the service life of a battery as described above. The inventive computer program product is carried by a medium readable by a computer (e.g., a carrier wave signal, a floppy disc, a hard drive, a random access memory, etc.).

Other objects, features and advantages of the present invention will become more fully apparent from the following detailed description of the preferred embodiments, the appended claims and the accompanying drawings.

BRIEF DESCRIPTION OF THE PREFERRED EMBODIMENTS

The present invention is described with reference to the accompanying drawings. In the drawings, like reference numbers indicate identical or functionally similar elements. Additionally, the left-most digit of a reference number identifies the drawing in which the reference number first appears.

Figure 2:
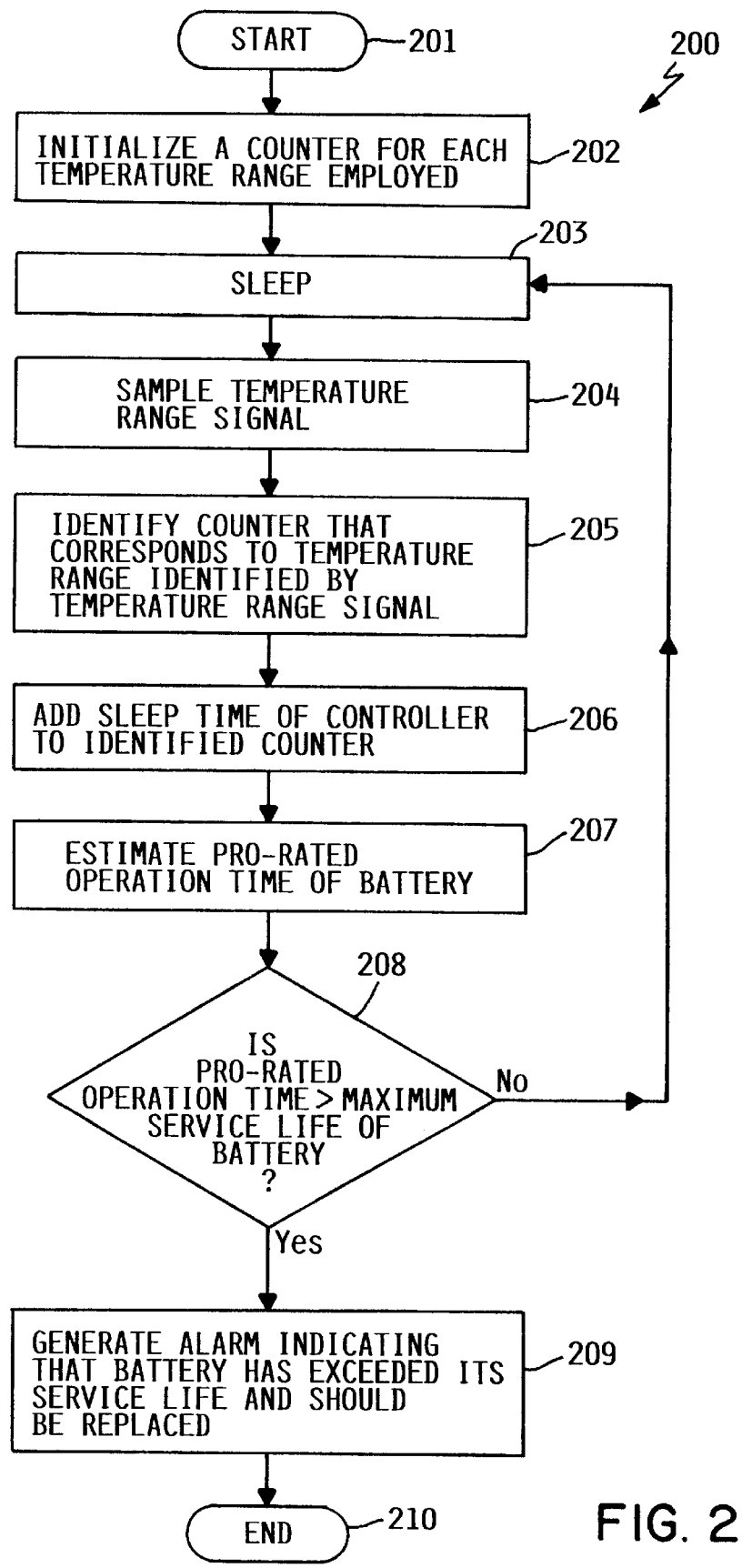

FIG. 1 is a schematic diagram of a novel service life estimation circuit for estimating the service life of a battery in accordance with the present invention; and FIG. 2 is a flow chart of a service life estimation algorithm for use with the service life estimation circuit of FIG. 1.

DETAILED DESCRIPTION OF THE PREFERRED EMBODIMENTS

FIG. 1 is a schematic diagram of a novel circuit (e.g., service life estimation circuit 100) for estimating the service life of a battery in accordance with the present invention. The service life estimation circuit 100 comprises a temperature measurement circuit 102 for measuring the temperature of an operating environment of a battery and for outputting a signal representative of the measured temperature; and a controller 104 coupled to the temperature measurement circuit 102 for receiving the temperature signal and for estimating the service life of the battery based thereon.

In the preferred embodiment of the present invention, the temperature measurement circuit 102 measures an operating environment temperature of a battery and outputs to the controller 104 a temperature range signal that indicates in which of a plurality of temperature ranges the measured operating environment temperature resides. Within the controller 104 a counter is associated with each of the plurality of temperature ranges set by the temperature measurement circuit 102. Each counter counts the amount of time the battery is operated within the temperature range associated with the respective counter. The battery's total operation time thereby can be obtained by adding together the counts of each counter.

Moreover, to determine if the battery's service life has been exceeded, and thus whether the battery should be replaced, a pro-rated operation time (rather than the actual operation time) of the battery is computed (e.g., by multiplying any battery operation time at elevated temperatures by a pro-rate factor which is greater than one) to account for elevated temperature operation of the battery. The pro-rated operation time of the battery is compared to a maximum service life of the battery (e.g., the service life of the battery if the battery is operated in a low temperature environment such as 28° C. or less for a NiMH battery). If the pro-rated operation time exceeds the maximum service life of the battery, an alarm is generated to indicate that the battery should be replaced. Thus, although battery life varies depending on the environmental temperature in which the battery operates, the invention allows for an accurate estimate of battery life regardless of the operating environment temperature.

With reference to FIG. 1, the temperature measurement circuit 102 comprises a thermistor 106 (e.g., a Mitsubishi Materials Corporation Model No. TH20-3V103F thermistor or any other suitable thermistor) coupled to an encoder circuit 108 via a first voltage divider circuit 110, and a second voltage divider circuit 112 coupled to the encoder circuit 108. The first voltage divider circuit 110 comprises a first resistor 114 coupled between a power supply rail ($V_{CC}$) and a thermistor node 116, and a second resistor 118 coupled between the thermistor node 116 and ground. The thermistor 106 also is coupled between the thermistor node 116 and ground.

The second voltage divider circuit 112 comprises a third resistor 120 coupled between the power supply rail ($V_{CC}$) and a first reference node 122, a fourth resistor 124 coupled between the first reference node 122 and a second reference node 126, a fifth resistor 128 coupled between the second reference node 126 and a third reference node 130, and a sixth resistor 132 coupled between the third reference node 130 and ground. As described further below, each voltage divider circuit 110, 112 generates one or more reference voltages based on a common voltage supply (e.g., the power supply rail ($V_{CC}$)). Accordingly, the power supply rail ($V_{CC}$) need not be tightly regulated because any voltage fluctuations present thereon will have an equivalent affect on each voltage divider circuit (and any reference voltage or voltages generated thereby). It will be understood that regulated reference voltages and conventional regulation circuitry associated therewith (e.g., Zener diodes and the like) may be employed to generate the various reference voltages described herein.

The encoder circuit 108 comprises a first comparator 134, a second comparator 136 and a third comparator 138 each having a positive input terminal coupled to the thermistor node 116. The negative input terminals of the first comparator 134, the second comparator 136 and the third comparator 138 are coupled to the first reference node 122, to the second reference node 126 and to the third reference node 130, respectively. The output of the second comparator 136 serves as an "X" output of the encoder circuit 108 and the outputs of the first comparator 134 and the third comparator 138 are combined via an XOR gate 140 to serve as a "Y" output of the encoder circuit 108. The comparators 134–138 may comprise any conventional comparator, but preferably comprise comparators having hysteresis (such as Maxim Corporation Model No. MAX8214 comparators) so as to limit toggling of the X and Y outputs of the encoder circuit 108 as described below. Note that a decoupling capacitor 141 preferably is coupled between the power supply rail ($V_{CC}$) and ground for noise reduction purposes as is known in the art.

In operation, the temperature measurement circuit 102 generates a two bit output signal (e.g., outputs X, Y of the encoder circuit 108) that indicates in which of four temperature ranges the temperature (as measured by the thermistor 106) of an operating environment of a battery resides. Specifically, as shown in TABLE 1 below, the thermistor 106 has a resistance ($R_{106}$) that varies with temperature from about 10 Kohms at 25° C. to about 6.258 Kohms at 36° C. In response to the resistance variations of the

TABLE 1

| T (° C.) | $R_{106}$ (ohms) | $V_{116}$ (volts) | $V_{122}$ (volts) | $V_{126}$ (volts) | $V_{130}$ (volts) | Y | X |
|---|---|---|---|---|---|---|---|
| 25 | 10 K | 2.075 | 2.007 | 1.910 | 1.808 | 0 | 1 |
| 28 | 8.77 K | 2.005 | 2.007 | 1.910 | 1.808 | 1 | 1 |
| 32 | 7.392 K | 1.907 | 2.007 | 1.910 | 1.808 | 1 | 0 |
| 36 | 6.258 K | 1.805 | 2.007 | 1.910 | 1.808 | 0 | 0 | thermistor 106, the first voltage divider circuit 110 generates a temperature-sensitive voltage signal at the node 116 ($V_{116}$) that depends on the resistance ($R_{106}$) of the thermistor 106, the resistance ($R_{114}$) of the first resistor 114, the resistance ($R_{118}$) of the second resistor 118 and the power supply rail voltage ($V_{CC}$) via equation (1) below:

$$V_{116} = V_{cc} \frac{R_{TOTAL}}{R_{TOTAL} + R_{114}} \text{ where } R_{TOTAL} = \frac{R_{106} R_{118}}{R_{106} + R_{118}} \quad (1)$$

TABLE 1 lists values for the temperature-sensitive voltage signal ($V_{116}$) at operating environment temperatures of 25° C., 28° C., 32° C. and 36° C. (for the resistance values listed in TABLE 2).

TABLE 2

| $R_{114}$ (ohms) | $R_{118}$ (ohms) | $R_{120}$ (ohms) | $R_{124}$ (ohms) | $R_{128}$ (ohms) | $R_{132}$ (ohms) |
|---|---|---|---|---|---|
| 6.04 K | 7.50 K | 60.4 K | 1.96 K | 2.05 K | 36.5 K |

The temperature-sensitive voltage signal ($V_{116}$) is fed to the negative input terminal of each of the comparators 134–138, while the positive voltage terminal of each comparator 134–138 is held at a reference voltage $V_{122}$, $V_{126}$ and $V_{130}$, respectively (the voltages of the first, second and third reference nodes 122, 126, 130). The reference voltages $V_{122}$, $V_{126}$ and $V_{130}$ are set by the second voltage divider circuit 112 and are governed by equations (2)–(4) below:

$$V_{122} = V_{CC} \frac{R_{124} + R_{128} + R_{132}}{R_{120} + R_{124} + R_{128} + R_{132}} \quad (2)$$

$$V_{126} = V_{CC} \frac{R_{128} + R_{132}}{R_{120} + R_{124} + R_{128} + R_{132}} \quad (3)$$

$$V_{130} = V_{CC} \frac{R_{132}}{R_{120} + R_{124} + R_{128} + R_{132}} \quad (4)$$

where $R_{120}$, $R_{124}$, $R_{128}$ and $R_{132}$ are the resistances, respectively, of the resistors 120–132. TABLE 1 lists the values of the first, second and third reference voltages $V_{122}$, $V_{126}$, $V_{130}$ of the first, second and third reference nodes 122, 126, 130, respectively, for the resistance values listed in TABLE 2.

With the reference voltage of each comparator 134–138 thus fixed, each comparator 134–138 outputs a positive voltage level (e.g., $V_{CC}$) if the temperature-sensitive voltage signal ($V_{116}$) is greater than the comparator's reference voltage, and outputs zero volts if the temperature-sensitive voltage signal ($V_{116}$) is less than the comparator's reference voltage. For example, with reference to TABLE 1, if the operating environment temperature of a battery (as measured by the thermistor 106) is 25° C. or less, the temperature-sensitive voltage signal ($V_{116}$) exceeds the first, the second and the third reference voltages $V_{122}$, $V_{126}$ and $V_{130}$. Each comparator output is driven high (e.g., to $V_{CC}$) and in response thereto, the X output of the encoder circuit 108 is driven high by the second comparator 136 and the Y output of the encoder circuit 108 is driven low by the XOR gate 140.

The temperature-sensitive voltage signal ($V_{116}$) remains above all three reference voltages $V_{122}$, $V_{126}$ and $V_{130}$ until a temperature of about 28° C. when the temperature-sensitive voltage signal ($V_{116}$) no longer exceeds the first reference voltage $V_{122}$, but remains in excess of the second and third reference voltages $V_{126}$, $V_{130}$. With the first reference voltage $V_{122}$ no longer exceeded, the output of the first comparator 134 is low while the outputs of the second and third comparators 136, 138 remain high. In response thereto, the X output of the encoder circuit 108 remains high (due to the high voltage level output by the second comparator 136) while the Y output of the encoder circuit 108 is driven high (e.g., due to the low voltage level and the high voltage level from the first and third comparators 134, 138, respectively, fed to the XOR gate 140).

Note that because the comparators 134–138 preferably have hysteresis associated therewith, once the temperature-sensitive voltage signal ($V_{116}$) exceeds a reference voltage associated with one of the comparators 134–138, and the comparator's output voltage switches polarity in response thereto, the comparator's output polarity will remain in its new polarity state despite small variations in the voltage signal ($V_{116}$) about the reference voltage. In this manner, small temperature fluctuations about a temperature that represents a temperature range "boundary" of the temperature measurement circuit 102 (e.g., about 2820 C., 32° C. or 36° C.) will not cause the X and Y outputs of the encoder circuit 108 to transition. The number of X and Y output transitions thereby is reduced, as is the likelihood that the controller 104 will read a transitorial and potentially false voltage level on either the X or Y output during battery service life estimation (described below). To further reduce potential false voltage level readings by the controller 104, the X and Y outputs of the encoder circuit 108 switch polarity using a "grey code" scheme wherein only one of the X and Y outputs switches polarity when a temperature range boundary is reached. Accordingly, even if the controller 104 erroneously reads one of the X and Y outputs before or while it transitions, and identifies an improper temperature range based thereon, the improperly identified temperature range will be within one temperature range of the proper temperature range (e.g., minimizing the error). A grey code scheme also eliminates any potential false readings by the controller 104 due to differing switching rates of the X and Y outputs of the encoder circuit 108.

The temperature-sensitive voltage signal ($V_{116}$) remains above the second and third reference voltages $V_{126}$, $V_{130}$ until a temperature of about 32° C. when the temperature-sensitive voltage signal ($V_{116}$) no longer exceeds the second reference voltage $V_{126}$, but remains in excess of the third reference voltage $V_{130}$. With the first and second reference voltages $V_{122}$, $V_{126}$ no longer exceeded, the outputs of the first and second comparators 134, 136 are low while the output of the third comparator 138 remains high. In response thereto, the X output of the encoder circuit 108 is driven to zero volts by the second comparator 136 while the Y output of the encoder circuit 108 remains high (as the voltage levels that feed the XOR gate 140 remain unchanged).

The temperature-sensitive voltage signal ($V_{116}$) remains above the third reference voltage $V_{130}$ until a temperature of about 36° C. is reached. Thereafter, with no reference voltage exceeded, the output of each comparator 134–138 is driven low, as are the X and Y outputs of the encoder circuit 108. Because the temperature-sensitive voltage ($V_{116}$) continues to decrease with increasing temperature, the X and Y outputs remain low for all temperatures in excess of 36° C.

In summary, the temperature measurement circuit 102 measures a temperature of an operating environment of a battery (via the thermistor 106) and outputs a signal (the X and Y outputs) that represents a temperature range in which the measured operating temperature resides. In the preferred embodiment of FIG. 1, an embodiment specifically adapted for use with NiMH batteries, the four temperature ranges in which a measured temperature may reside (and the corresponding X and Y outputs from the encoder circuit 108) are listed in TABLE 3. It will be understood that the temperature measurement circuit 102 may be configured for use with other batteries and/or other or more temperature ranges if desired.

TABLE 3

| TEMPERATURE RANGE (° C.) | Y OUTPUT | X OUTPUT |
|---|---|---|
| <28 | 0 | 1 |
| about 28–32 | 1 | 1 |
| about 32–36 | 1 | 0 |
| >36 | 0 | 0 |

The controller 104 receives the X and Y outputs (e.g., the temperature range signal) from the temperature measurement circuit 102 and estimates the service life of a battery based thereon (as described below). Preferably the controller 104 comprises a microcontroller or microprocessor such as an IBM PowerPC™ 403 processor having program code stored therein that performs battery service life estimation functions. For example, the X and Y outputs of the temperature measurement circuit 102 may be input by an input/output (I/O) module 142 of the controller 104 (e.g., via I/O pins (not shown) of an I/O port 144 of the controller 104). The temperature range information encoded by the X and Y outputs (TABLE 3) then may be used by software (e.g., program code) within a random access or read only memory (represented generally by reference number 146) of the controller 104 for battery service life estimation as described below. Alternatively, hardware (e.g., discreet counters, logic modules, application specific integrated circuits, etc.) or a combination of hardware and software may be similarly employed.

The operation of the controller 104 is now described with reference to FIG. 1 and with reference to FIG. 2 which is a flow chart of a preferred service life estimation algorithm 200. It is assumed that a new battery such as a NiMH battery 200 (not shown) having its maximum service life remaining (e.g., 36 months for an operating temperature of about 28° C. or less) is monitored by placing the thermistor 106 proximate the battery (e.g., on, next to or sufficiently close to the battery to monitor the operating environment temperature of the battery).

With reference to FIG. 2, in step 201, the service life estimation algorithm 200 begins. In step 202, a counter is initialized (e.g., is created and is set to zero) for each temperature range to be monitored. For the preferred embodiment of the service life estimation circuit 100 of FIG. 1, four temperature ranges may be monitored as shown in TABLE 3 (e.g., less than about 28° C., between about 28–32° C., between about 32–36° C. and greater than about 36° C.). Accordingly, four counters 148, 150, 152 and 154 are initialized for (i.e., are associated with) the temperature ranges of less than about 28° C., between about 28–32° C., between about 32–36° C. and greater than about 36° C., respectively. The counters 148–154 preferably are software-based, 8-byte counters defined within the memory 146 as is known in the art. It will be understood that the spatial boundaries and arrangement of the counters 148–154 in FIG. 1 are arbitrary and are shown merely for convenience.

Following initialization of the counters 148–154, in step 203 the controller 104 waits or "sleeps" for a predetermined time period (e.g., to allow the battery to age). The preferred sleep period for the controller 104 is about 5 minutes although any other time period (if any) may be employed.

In step 204, the temperature range signal (e.g., the X and Y outputs) of the temperature measurement circuit 102 is sampled to identify in which of the four temperature ranges the current operating environment temperature of the battery resides (e.g., below about 28° C., between about 28–32° C., between about 32–36° C. or above about 36° C.). Specifically, program code within the memory 146 (represented in FIG. 1 as estimation and processing code 156 for convenience) directs the I/O module 142 to input the voltage levels of the X and Y inputs. Thereafter, in step 205, the estimation and processing code 156 interprets these voltage levels in accordance with TABLE 3 to determine in which temperature range the current operating environment temperature of the battery resides. The counter associated with the temperature range also is identified.

In step 206, the estimation and processing code 156 adds the sleep time of the controller 104 (e.g., the time between temperature samples) to the count of the counter associated with the temperature range identified by the X and Y outputs of the temperature measurement circuit 102. For example, if in step 205 the estimation and processing code 156 determines that the operating environment temperature of the battery resides within the temperature range from about 28° C. to 32° C. (e.g., because the X and Y outputs of the temperature measurement circuit 102 have high logic levels), the estimation and processing code 156 increases the count of the second counter 150 by the sleep time of the controller 104 (e.g., by about 5 minutes).

In step 207, the estimation and processing code 156 computes the total operation time of the battery by adding together the count of each counter 148–154. To compensate for the decrease in battery service life from its maximum value (e.g., 36 months for NiMH batteries operated at about 28° C. or less) that accompanies battery operation at elevated temperatures, a pro-rate factor is assigned to each counter 148–154 that weights the count of each counter 148–154 based on the temperature range associated with the counter. Specifically, the counts of counters having high temperature ranges associated therewith (e.g., counters 152 and 154) are weighted more heavily than the counts of counters having low temperature ranges associated therewith (e.g., counters 148 and 150) so that when the battery is operated at temperatures above about 28° C. the computed operating time of the battery exceeds the actual operating time of the battery. The battery thereby is aged more quickly when operated at higher temperatures. Preferably, the pro-rate factor for the count of the first counter 148 ($C_{148}$) is 1.0, the pro-rate factor for the count of the second counter 150 ($C_{150}$) is 1.22, the pro-rate factor for the count of the third counter 152 ($C_{152}$) is 1.50 and the pro-rate factor for the count of the fourth counter 154 ($C_{154}$) is 1.83. The pro-rated operation time ($T_{PRORATED}$) of the battery therefore is governed by equation (5) below:

$$T_{PRORATED} = C_{148} + 1.22 C_{150} + 1.5 C_{152} + 1.83 C_{154}$$

In this manner, if a battery is operated at a temperature of about 28° C. or less, the battery is aged at its actual rate (so that an effective service life of 35.75 months is employed for the battery), but if the battery is operated at a temperature of about 36° C. or higher, the battery is aged at 1.83 times its actual rate (so that an effective service life of 19.5 months is employed for the battery). The battery is aged at an intermediate rate for intermediate temperature operation. Further, by including the time the battery is operated within each temperature range during battery service life estimation, both the present and the past operating environment temperatures of the battery are considered during battery life estimation. Accordingly, an accurate estimation of battery service life is computed even if a battery is operated at several different operating environment temperatures during its lifetime. Note that for a binary count, pro-rate factors of 1.25, 1.5 and 1.875 may be obtained by appropriate shifting and addition operations as will be apparent to one of ordinary skill in the art (e.g., to generate 1.875X for a count of X, the count X may be added to the count X shifted to the right by 1 bit, shifted to the right by 2 bits and shifted to the right by 3 bits).

In step 208, the estimation and processing code 156 compares the pro-rated operation time of the battery to the maximum service life of the battery (e.g., the service life of the battery if operated at 28° C. or less). If the pro-rated operation time of the battery is less than the maximum service life of the battery, control passes to step 203, and steps 203–207 are repeated (e.g., the controller 104 sleeps, a new temperature range signal is sampled, the controller sleep time is added to the appropriate counter and the pro-rated operation time is computed). This process is repeated until the pro-rated operation time exceeds the maximum service life of the battery, after which time control passes to step 209.

In step 209, the estimation and processing code 156 generates a signal (e.g., an alarm signal output by the I/O module 142 of the controller 104) to indicate that the service life of the battery has been exceeded and that the battery should be replaced. In step 210, the service life estimation algorithm 200 ends.

The foregoing description discloses only the preferred embodiments of the invention, modifications of the above disclosed apparatus and method which fall within the scope of the invention will be readily apparent to those of ordinary skill in the art. For instance, while the present invention has been described primarily with reference to NiMH batteries, other battery technologies may similarly benefit from the invention. Other temperature measurement means than the thermistor 106 such as a silicon pn-junction diode may be employed, as may other resistance values for the resistors 114–132, other temperature ranges and other pro-rate factors.

Accordingly, while the present invention has been disclosed in connection with the preferred embodiments thereof, it should be understood that other embodiments may fall within the spirit and scope of the invention, as defined by the following claims.

The invention claimed is:

1. An apparatus adapted to estimate the service life of a battery comprising:
   a temperature measurement circuit adapted to measure a temperature of an operating environment of the battery and to output a signal representative of a temperature range in which the operating environment temperature resides; and
   a controller coupled to the temperature measurement circuit and adapted to estimate the service life of the battery based on the signal output by the temperature measurement circuit.

2. The apparatus of claim 1 wherein the temperature measurement circuit comprises:
   a thermistor having a resistance that varies with temperature, the resistance of the thermistor providing a measure of the temperature of the operating environment of the battery; and
   an encoder circuit coupled to the thermistor and adapted to generate at least one bit representative of the temperature range in which the operating environment temperature of the battery resides based on the resistance of the thermistor.

3. The apparatus of claim 2 further comprising:
   a first voltage divider circuit coupled to the thermistor and adapted to generate a temperature-sensitive voltage signal based on the resistance of the thermistor; and
   a second voltage divider circuit coupled to the encoder circuit, the second voltage divider circuit adapted to generate at least one reference voltage; and
   wherein the encoder circuit comprises a comparator circuit adapted to:
      compare the temperature-sensitive voltage signal to the at least one reference voltage;
      generate a first voltage level if the temperature-sensitive voltage signal is greater than the at least one reference voltage; and
      generate a second voltage level if the temperature-sensitive voltage signal is less than the at least one reference voltage.

4. The apparatus of claim 3 wherein the second resistive divider is adapted to generate a plurality of reference voltages and wherein the comparator circuit includes a plurality of comparators, each comparator adapted to:
   compare the temperature-sensitive voltage signal to a different one of the plurality of reference voltages;
   generate a first voltage level if the temperature-sensitive voltage signal is greater than the different one of the reference voltages; and
   generate a second voltage level if the temperature-sensitive voltage signal is less than the different one of the reference voltages.

5. The apparatus of claim 4 wherein the encoder circuit further comprises circuitry coupled to the plurality of comparators and adapted to encode the voltage levels generated by the plurality of comparators into a plurality of bits indicative of the temperature range in which the operating environment temperature resides.

6. The apparatus of claim 1 wherein the controller comprises:
   a plurality of counter means, each counter means having a count and a temperature range associated therewith, each counter means for counting a time the battery is operated within the temperature range associated with the counter means; and
   estimation means for estimating the service life of the battery based on the count of each counter means.

7. The apparatus of claim 6 wherein the estimation means comprises means for estimating the service life of the battery based on the count of each counter means and a pro-rate factor for each counter means that depends on the temperature range associated with the counter means.

8. The apparatus of claim 7 wherein the plurality of counter means comprise:
   a first counter means having a temperature range of less than about 28° C. associated therewith;
   a second counter means having a temperature range of between about 280° C. and about 32° C. associated therewith;
   a third counter means having a temperature range of between about 32° C. and about 36° C. associated therewith; and
   a fourth counter means having a temperature range of greater than about 36° C. associated therewith.

9. The apparatus of claim 8 wherein:
   the pro-rate factor for the first counter means is about 1.0;
   the pro-rate factor for the second counter means is about 1.22;
   the pro-rate factor for the third counter means is about 1.5; and
   the pro-rate factor for the fourth counter means is about 1.83.

10. The apparatus of claim 1 wherein the controller comprises means for periodically estimating the service life of the battery.

11. The apparatus of claim 10 wherein the controller comprises means for estimating the service life of the battery about every 5 minutes.

12. The apparatus of claim 1 wherein the controller comprises means for generating an alarm if a maximum service life of the battery is exceeded.

13. A method of estimating the service life of a battery comprising:
   measuring a temperature of an operating environment of the battery;
   outputting a signal representative of a temperature range in which the operating environment temperature resides; and
   estimating the service life of the battery based on the signal representative of the temperature range in which the operating environment temperature resides.

14. The method of claim 13 wherein outputting a signal representative of a temperature range in which the operating environment temperature resides comprises outputting at least one bit representative of the temperature range in which the operating environment temperature resides.

15. The method of claim 13 wherein estimating the service life of the battery comprises:
   determining a time the battery is operated within each of a plurality of temperature ranges; and
   estimating the service life of the battery based on the time the battery is operated within each of the plurality of temperature ranges.

16. The method of claim 15 wherein estimating the service life of the battery comprises estimating the service life of the battery based on the time the battery is operated within each of the plurality of temperature ranges and based on a pro-rate factor for each temperature range.

17. The method of claim 13 further comprising generating an alarm if a maximum service life of the battery is exceeded.

18. An apparatus for estimating the service life of a battery comprising:

temperature measurement means for measuring a temperature of an operating environment of a battery and for outputting a signal representative of a temperature range in which the temperature resides; and estimating means coupled to the temperature measurement means, the estimating means for estimating the service life of the battery based on the signal output by the temperature measurement means.

19. An apparatus adapted to estimate the service life of a battery comprising:

a temperature measurement circuit adapted to measure a temperature of an operating environment of the battery and to output a signal representative of a temperature range in which the operating environment temperature resides; and a controller coupled to the temperature measurement circuit and adapted to receive the signal output by the temperature measurement circuit and to estimate the service life of the battery based on the signal output by the temperature measurement circuit, wherein the controller comprises:

a plurality of counter means, each counter means having a count and a temperature range associated therewith, each counter means for counting a time the battery is operated within the temperature range associated with the counter means; and estimation means for estimating the service life of the battery based on the count of each counter means and a pro-rate factor for each counter means that depends on the temperature range associated with the counter means.

20. An apparatus adapted to estimate the service life of a battery comprising:

a temperature measurement circuit adapted to measure a temperature of an operating environment of the battery and to output a signal representative of a temperature range in which the operating environment temperature resides; and a controller coupled to the temperature measurement circuit and adapted to receive the signal output by the temperature measurement circuit and to estimate the service life of the battery based on the signal output by the temperature measurement circuit, wherein the controller comprises:

a plurality of counter means, each counter means having a count and a temperature range associated therewith, each counter means for counting a time the battery is operated within the temperature range associated with the counter means; and estimation means for estimating the service life of the battery based on the count of each counter means and a pro-rate factor for each counter means that depends on the temperature range associated with the counter means;

wherein the plurality of counter means comprise:

a first counter means having a temperature range of less than about 28° C. associated therewith and a pro-rate factor of about 1.0;

a second counter means having a temperature range of between about 28° C. and about 32° C. associated therewith and a pro-rate factor of about 1.22;

a third counter means having a temperature range of between about 32° C. and about 36° C. associated therewith and a pro-rate factor of about 1.5; and a fourth counter means having a temperature range of greater than about 36° C. associated therewith and a pro-rate factor of about 1.83.

* * * * *

UNITED STATES PATENT AND TRADEMARK OFFICE
CERTIFICATE OF CORRECTION

PATENT NO. : 6,191,556 B1
DATED : February 20, 2001
INVENTOR(S) : Robert Edward Galbraith; Jessica Marie Gisi; Steven Paul Norgaard; Dennis David Reetz; Donald James Ziebarth It is certified that error appears in the above-identified patent and that said Letters Patent is hereby corrected as shown below:

<u>Column 10,</u>
Line 13, replace "280° C." with -- 28° C. --

Signed and Sealed this

Twenty-third Day of October, 2001

*Attest:*

*Attesting Officer*

NICHOLAS P. GODICI
*Acting Director of the United States Patent and Trademark Office*